United States Patent [19]

Volluet et al.

[11] 4,392,115
[45] Jul. 5, 1983

[54] VOLUME MAGNETOSTATIC WAVE DEVICE

[75] Inventors: Gérard Volluet; Pierre Hartemann, both of Paris, France

[73] Assignee: Thomson-CSF, Paris, France

[21] Appl. No.: 253,268

[22] Filed: Apr. 13, 1981

[30] Foreign Application Priority Data

Apr. 14, 1980 [FR] France .................................. 80 08279

[51] Int. Cl.³ ...................... H03H 9/125; H03H 9/38; H03B 5/00
[52] U.S. Cl. ................................ 333/141; 331/107 A; 333/143; 333/149
[58] Field of Search ................................ 333/150-155, 333/193-196, 149, 141-145, 147-148; 331/96, 107 A; 310/313 R, 313 A, 313 B, 313 C, 313 D, 26

[56] References Cited

U.S. PATENT DOCUMENTS

| 3,401,360 | 9/1968 | Schulz Du Bois | 333/149 |
| 3,686,518 | 8/1972 | Hartmann et al. | 333/154 X |
| 3,866,154 | 2/1975 | Moore | 333/154 |
| 4,028,639 | 6/1977 | Hagon et al. | 331/96 |
| 4,087,714 | 5/1978 | La Rosa et al. | 310/313 B |
| 4,199,737 | 4/1980 | Patterson et al. | 333/154 |

FOREIGN PATENT DOCUMENTS 2447641 1/1979 France .

OTHER PUBLICATIONS

Adam et al.-"Microwave Magnetostatic Delay Devices Based on Epitaxial Yttrium Iron Garnet", Proc. of the IEEE, vol. 64, No. 5, May 1976; pp. 794-800.
Shimizu et al.-"Unidirectional Surface-Acoustic Wave Transducer by Meandering and Interdigital Electrodes", The Transactions of the Institute of Electronics and Communication Engineers of Japan, vol. 61, No. 7, Jul. 1978; pp. 557-558.
Adam et al.-"Interdigital Structures for Magnetostatic Wave Transversal Filters", 1978 IEEE International Symposium on Circuits and Systems Proceedings, Roosevelt Hotel, New York, May 17-19, 1978; pp. 569-573.
Miley-"Looking for a 3 DB to 8 DB Microstrip Coupler?", Microwaves vol. 13, No. 3, Mar. 1974; pp. 58-62.

Primary Examiner—Marvin L. Nussbaum
Attorney, Agent, or Firm—Cushman, Darby & Cushman

[57] ABSTRACT

The volume magnetostatic wave device comprises a unidirectional-radiation transducer composed of equidistant microstrips connected to a polyphase transformer and coupled to a ferrimagnetic wafer which is subjected to a polarizing magnetic field.

10 Claims, 10 Drawing Figures

VOLUME MAGNETOSTATIC WAVE DEVICE

This invention relates to volume magnetostatic wave devices. Magnetostatic waves are capable of propagating within a wafer or ferrimagnetic material which is subjected to a polarizing magnetic field. These waves are forward surface waves when the polarizing magnetic field is parallel to the principal faces of the wafer and when the direction of propagation is normal with respect to said field. The direction of propagation is established by orientation of a conductive microstrip which is brought into contact with the surface of the wafer. Magnetostatic waves are excited by circulating a very-high-frequency alternating current within the microstrip. Similarly, said microstrip can perform the function of a transducer-receiver or in other words the function of a transducer for converting the energy of the magnetostatic waves to electrical energy. In the case of surface magnetostatic wave operation, the microstrip behaves as a unidirectional transducer, with the result that the energy exchange between two microstrips placed in opposite relation can take place with relatively low losses. However, at a frequency of 3 GHz, the power saturation level of the magnetostatic surface waves is at a value of 20 dB below the power saturation level of the volume magnetostatic waves.

In regard to the volume magnetostatic waves, the transducer effect obtained by means of a microstrip is essentially bidirectional. Volume magnetostatic waves are either forward waves or backward waves, depending on whether the excitation magnetic field is perpendicular to the surface of the wafer or oriented in the direction of propagation. The group velocity has the same direction as the phase velocity in the case of forward waves. These velocities are opposite when the waves are backward waves. Along the surface of the wafer, volume magnetostatic forward waves propagate in a practically isotropic manner but this is not the case either with volume magnetostatic backward waves or with surface magnetostatic waves.

Bidirectional operation of microstrips for emitting and receiving volume magnetostic waves has the disadvantage of reducing by 6 dB the electric power which can be exchanged between two microstrips. Furthermore, energy which is radiated to no useful purpose is liable to give rise to objectionable reflections which have to be attenuated by means of a suitable treatment of the edges of the wafer.

It is possible to associate a U-shaped coupler with a microstrip in order to obtain unidirectional operation. This solution, however, results in an increase in length of the wafer of ferrimagnetic material and may have the effect of limiting the useful frequency band.

The invention is directed to a volume magnetostatic wave device provided with at least one microstrip transducer at the surface of a wafer of ferrimagnetic material. The distinctive feature of the device lies in the fact that the transducer comprises an array of filament-type conductive elements spaced at the same intervals and having the same length; the terminals of said transducer are connected electrically to the conductive elements of said array through a polyphase transformer circuit; the complex ampitudes of the currents which flow through said conductive elements have the same modulus and arguments in arithmetical progression in which the common difference is equal to the phase shift of a volume magnetostatic wave which travels across each interval aforesaid in the predetermined direction of propagation.

Other features of the invention will be more apparent upon consideration of the following description and accompanying drawings, wherein.

Figure 1:
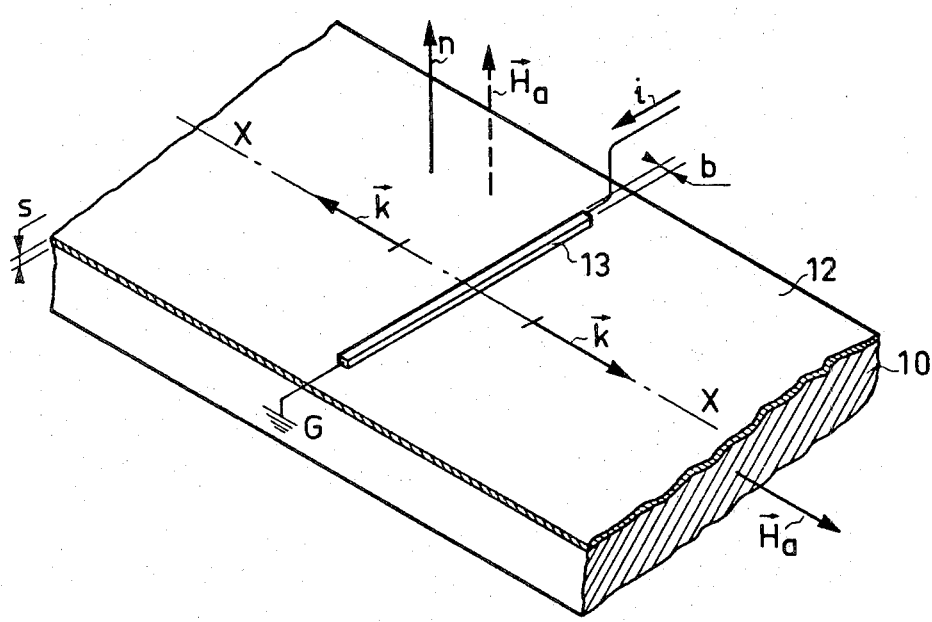
FIG. 1 is a view in isometric perspective showing a transducer device of known type for the propagation of volume magnetostatic waves.

There is shown in FIG. 1 a volume magnetostatic wave device equipped with a transducer in the form of a microstrip 13. A wafer of ferrimagnetic material is formed by depositing on a substrate 10 of gadolinium and gallium garnet (GGG) an epitaxial layer 12 of yttrium and iron garnet (YIG) having a thickness s of a few tens of microns. This material has a ferrimagnetic resonance line having a width which does not exceed a fraction of Oersted. This results in propagation losses of the order of 38 dB/$\mu$s in the X-band ($\Delta H = 0.5$ Oersted). In order to excite or collect the volume magnetostatic waves, use is made of a microstrip 13 provided in the form of a filament-type conductive element having a width b. The microstrip 13 can be formed by metallization of the top face of the layer 12 or by metallization performed on a thin dielectric strip which is placed on the layer 12. One end of the microstrip 13 is connected to ground G and the other end constitutes an input terminal. By causing a very-high-frequency current i to flow through the microstrip 13, volume magnetostatic waves having a wave number k are radiated in both directions of the axis of propagation X—X. These volume waves are of the backward type when the polarizing magnetic field $H_a$ designated by a full line is applied to the layer 12. Said field is oriented along the axis X—X and is consequently contained within the plane of the layer 12. The volume magnetostatic waves are forward waves when the polarizing magnetic field $\vec{H_a}$ is oriented along the normal n to the layer 12 (dashed-line arrow). The volume magnetostatic forward waves have the advantage of propagating within the layer 12 at a velocity which is practically not dependent on the orientation given to the axis X—X at right angles to the microstrip 13.

Figure 2:
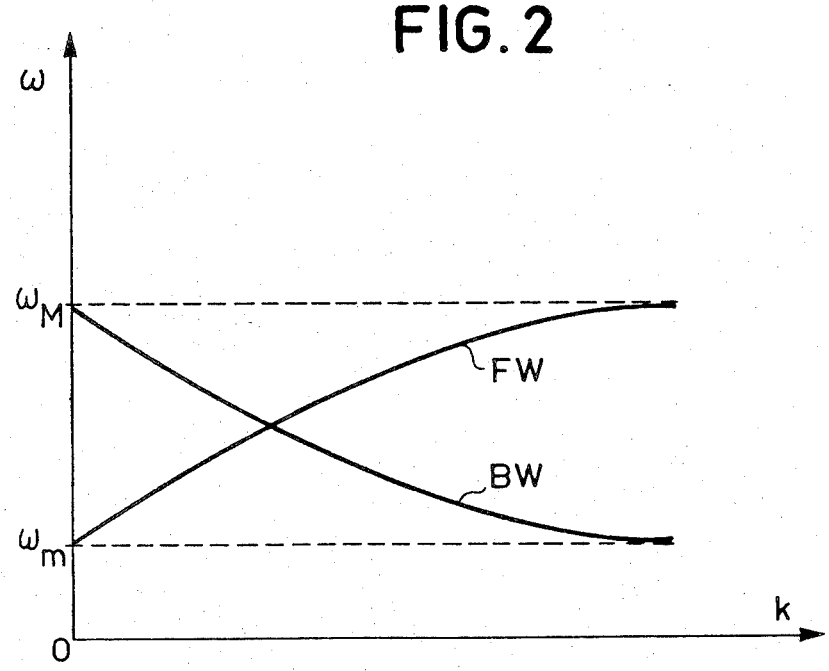
FIG. 2 is an explanatory diagram.

FIG. 2 illustrates the properties of propagation of volume magnetostatic waves. The wave number k which is equal to the ratio of angular velocity $\omega$ to the phase velocity $v_\psi$ of the waves has been plotted as abscissae. The domain of existence of the waves is located between the two dashed lines having ordinates $\omega_m$ and $\omega_M$. The minimum angular frequency $\omega_m$ is defined by the following relation:

$$\omega_m = \gamma \cdot H_i \qquad (1)$$

The maximum angular frequency is given by the relation:

$$\omega_M = \gamma \sqrt{H_i(H_i + 4\pi M)} \qquad (2)$$

where
  $\gamma$ is the gyromagnetic ratio equal to 2.8 MHz/Oe in the case of YIG
  $4\pi M$ is the magnetization at saturation equal to 1760 Oe in the case of YIG
  $H_i$ is the internal field which differs from the polarizing field $H_a$ by reason of the demagnetizing effect of the layer 12.

The curve FW relates to volume magnetostatic forward waves and indicates the progressive variation of the angular frequency $\omega$ as a function of the wave number k in respect of a given value of the field $H_a$. The curve BW indicates the progressive variation characterizing volume magnetostatic backward waves. The slope of the curves BW and FW gives the value of the group velocity of the volume magnetostatic waves; the sign of said slope justifies the terminology of "forward" and "backward" waves adopted in this specification.

The domain of existence of the volume waves is such that:

$$\omega_m \leq 2\pi f \leq \omega_M \qquad (3)$$

where f is the frequency of the current i.

Said domain can be limited to a greater extent by the width b of the microstrip 13. In fact, the volume magnetostatic waves are excitable up to a wavelength $\lambda \geq b$.

Figure 3:
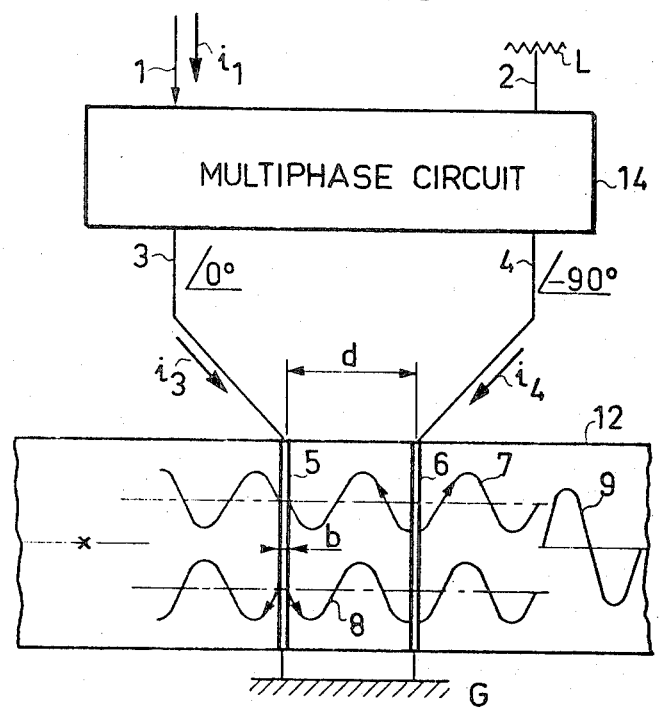
FIGS. 3 and 4 show volume magnetostatic wave devices according to the invention.

In FIG. 3, there is shown a first example of construction of a device for propagation of volume magnetostatic waves having unidirectional radiation. The ferrimagnetic layer 12 carries two filament conductors 5 and 6 located at a distance d from each other. A polyphase transformer 14 having four channels 1, 2, 3, 4 is connected by means of its channels 3 and 4 to the filament conductors 5 and 6. In the example under consideration, said transformer 14 is a 3-dB hybrid junction which delivers on its channels 3 and 4 currents $i_3$ and $i_4$ in phase quadrature and having equal amplitudes. A matched load L serves as a termination for the channel 2 in order to absorb the energy which appears on said channel when the conductors 5 and 6 are mismatched with respect to the intrinsic impedances of the channels 3 and 4. Excitation of the volume magnetostatic waves is effected by supplying the channel 1 in which the current $i_1$ flows. When the matching conditions are satisfied, the current $i_1$ has an amplitude which is higher by 3-dB than that of the current $i_3$ and the current $i_4$ has a phase lag of 90°, for example, with respect to the current $i_3$. The currents $i_3$ and $i_4$ flow through the conductors 5 and 6 and return via the ground plane G.

The emission of volume magnetostatic waves by the transducer strip 5 is bidirectional along an axis perpendicular to said strip. The sine curves 8 extending from the transducer 5 represent the fractions of radiated waves. In regard to the transducer strip 6, the fractions of radiated waves are phase-shifted by $-90°$ and are consequently represented by cosine curves 7. As can readily be understood, this presupposes sinusoidal excitation of the channel 1. It is apparent from FIG. 3 that the distance d is chosen so as to ensure that the two wave fractions 7 and 8 are added on the right-hand side so as to form a radiated wave 9 whereas they fall to zero to the left of the strips 5 and 6. The unidirectional radiation of the transducer assembly of FIG. 3 is therefore obtained on condition that:

$$d = n \cdot \lambda_n + \lambda_n/4 \qquad (4)$$

where $\lambda_n$ is the wavelength of the volume magnetostatic waves and n is a positive or zero whole number.

Relation (4) can be expressed in the form:

$$\lambda_n = \frac{4d}{4n + 1} \qquad (5)$$

Relations (4) and (5) are equally applicable both to emission towards the right and to reception of volume magnetostatic waves which come from the right. The cross shown to the right of the strips 5 and 6 indicates the inactive side of the assembly shown in FIG. 3.

Figure 4:
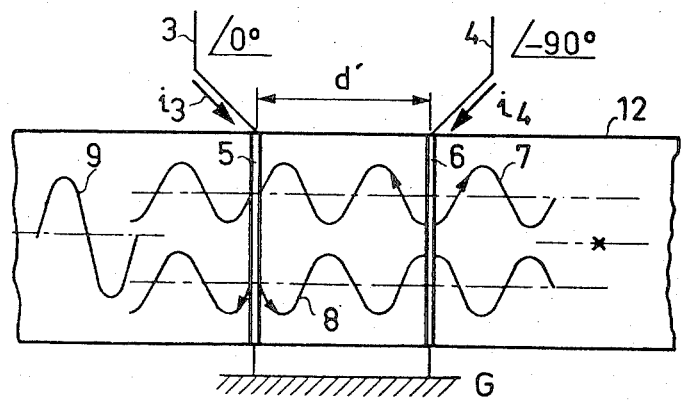

In FIG. 4, there is shown an alternative embodiment which differs from the embodiment of FIG. 3 only in the reversal of the unidirectional radiation. The distance d' between the strips 5 and 6 is given by the relation:

$$d' = m\lambda_m + \tfrac{3}{4}\lambda_m \qquad (6)$$

The distance can also be written in the form:

$$\lambda_m = \frac{4d'}{4m + 3} \qquad (7)$$

where $\lambda_m$ is the wavelength of the volume magnetostatic waves and m is a positive or zero whole number.

If the connections between the hybrid junction 14 and the arrays of strips 5 and 6 are changed over, two other possible configurations can be defined. Consideration can also be given to the insertion of a phase switch in one of the connections between the channel 4 and the strip 6, for example, in order to produce phase shifts from 0° to 180°. Depending on the state of the switch, unidirectional radiation takes place either in one direction or in the other.

When d or d' is of small value, unidirectionality may be acquired over a broad frequency band if the polyphase transformer 14 permits this broad-band mode of operation. However, the distances d and d' must not be reduced to the point of giving rise to strong interactions between the two microstrips since this would be liable to interfere with unidirectional operation of the transducer assembly.

By way of non-limitative example, a volume magnetostatic forward-wave delay line has been constructed by forming two-strip transducers at the surface of an alumina substrate, said strips being shown in FIGS. 3 and 4. The other face of the alumina substrate was entirely metallized in order to perform the function of a ground plane. The microstrips delimited by photolithography had a width b of 35 $\mu$m and a length of 4 mm. The distance d between said microstrips was 200 $\mu$m in the case of each array. The distance of propagation was 6 mm between the strips connected to the channels which had not been phase-shifted. Two hybrid couplers were employed, namely one coupler for emission and the other coupler for reception. An yttrium-iron-garnet layer 20.5 $\mu$m in thickness is formed by heteroepitaxy in liquid phase on a gallium-gadolinium garnet substrate having a thickness of 500 $\mu$m. The epitaxial layer is brought into contact with the etched face of the alumina wafer in order to cover the conductive strips of the two transducer assemblies. The connections of one of the two hybrid junctions are changed-over in order to ensure exchange of the volume magnetostatic waves. An external magnetic field is applied perpendicularly to the epitaxial layer in order to fix a frequency domain which is suitable for propagation of the volume magnetostatic forward waves. At a frequency of 2.12 GHz corresponding to a wavelength $\lambda_n$ of 800 μm, insertion losses not exceeding 10 dB have been measured (with n=0 and by employing relation (5)). The same device has a directivity of the order of 30 dB at 2.1 GHz and the passband is 340 MHz at 10 dB. By reversing the direction of exchange of the volume magnetostatic waves, an insertion loss of approximately 14 dB at 2.4 GHz is obtained with a similar passband.

Figure 5:
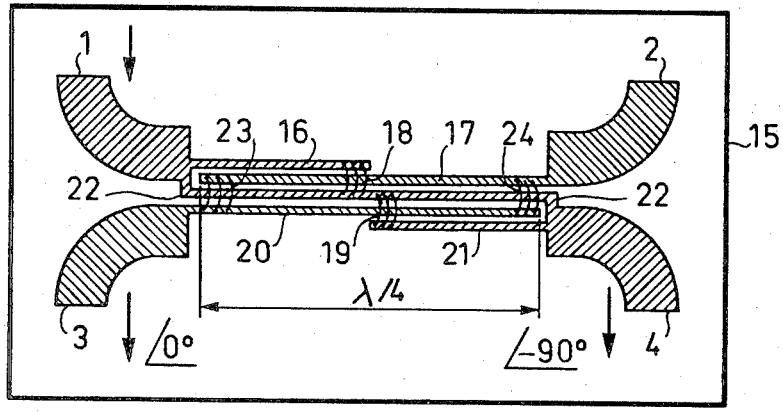
FIG. 5 shows a 3-dB hybrid junction.

In FIG. 5, there is shown a 3-dB directional coupler which is particularly suitable for the fabrication of the polyphase transformer 14. This so-called Lange coupler is formed at the surface of a dielectric wafer 15, the rear face of which is entirely metallized. The metallizations shown in FIG. 5 include the four channels 1, 2, 3 and 4 and an array of interdigitized microstrips which provide a close coupling between the channels over a distance in the vicinity of $\lambda_{EM}/4$. Channel 1 is connected to channel 4 by a conductor 22 placed between two conductors 17 and 20 which are connected respectively to channels 2 and 3. Conductors 16 and 21 of shorter length are connected to channels 1 and 4 in order to improve the coupling. Bridging connections 18, 19, 23 and 24 complete the structure of the coupler. The connections just mentioned are added after photolithography by thermocompression bonding of leads. The wavelength $\lambda_{EM}$ is that of the electromagnetic waves transmitted by the coupler.

Figure 6:
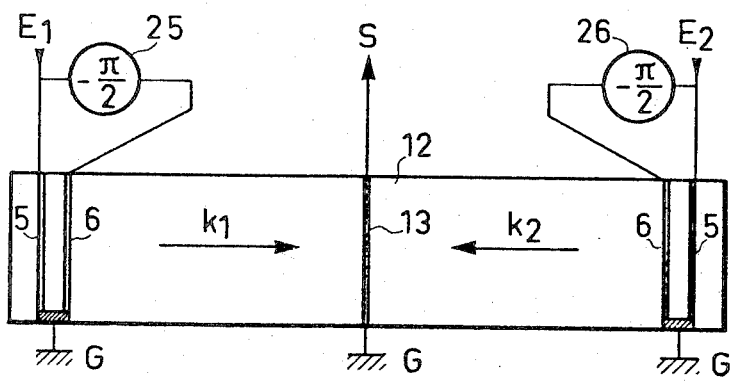
FIG. 6 shows a volume magnetostatic wave device which makes use of unidirectional transducers and of one bidirectional transducer.

FIG. 6 shows an alternative form of construction of a delay line which makes use of a bidirectional transducer 13 placed between two unidirectional transducers in accordance with the invention. The transducer assembly 5, 6, 25 emits volume magnetostatic waves having a wave number $k_1$ which are collected by the transducer 13. The transducer assembly 5, 6, 26 transmits volume magnetostatic waves having a wave number $k_2$ to the transducer 13. An exchange is established between each input $E_1$ and $E_2$ and the common output S. Many volume magnetostatic wave devices can be deduced from the foregoing examples. Among the different types, mention can be made of delay lines, filters, phase-shifters, discriminators, dispersive lines and tunable oscillators.

Figure 7:
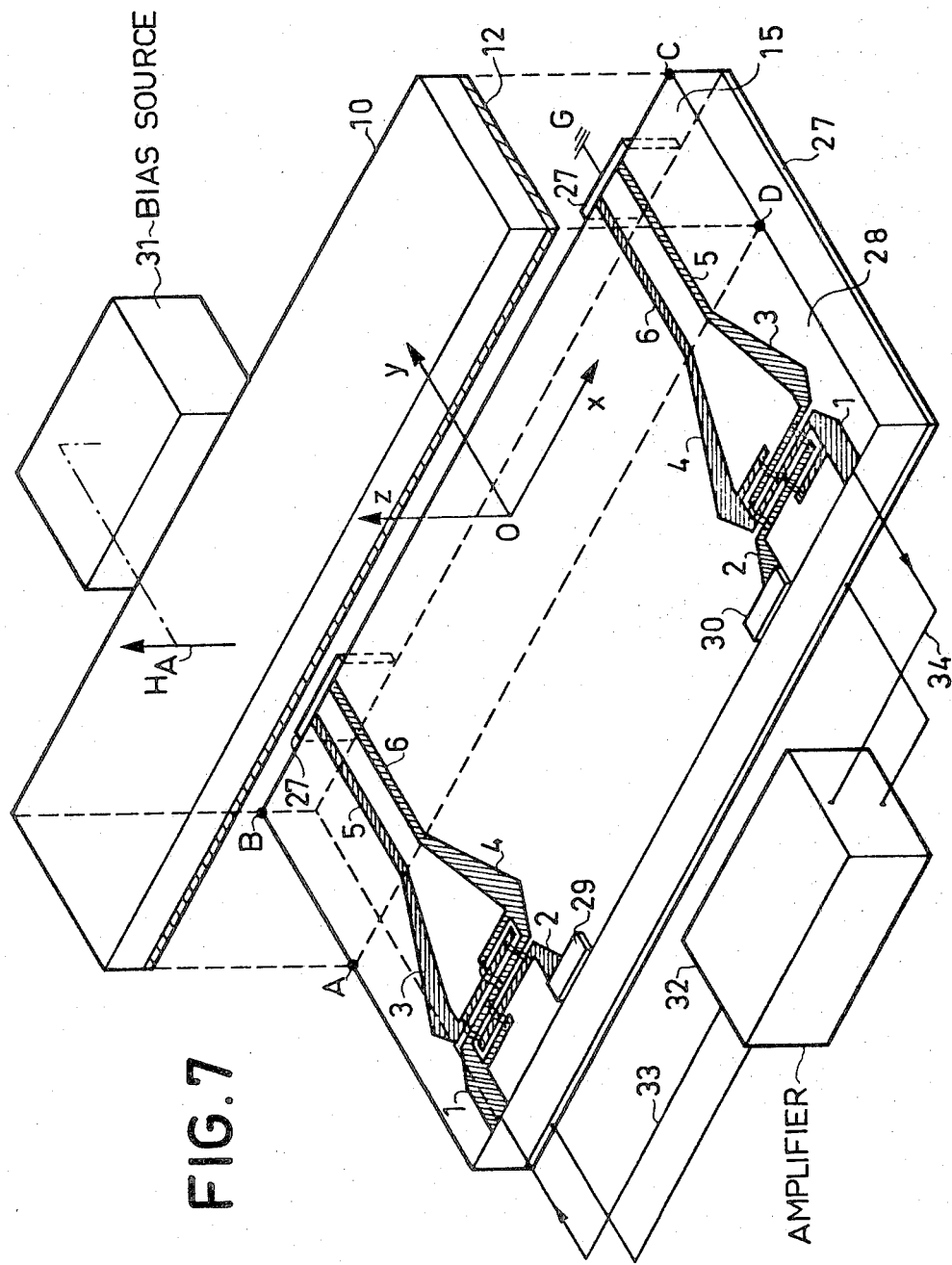
FIG. 7 shows a tunable oscillator for propagation of volume magnetostatic waves.

A tunable oscillator is illustrated in the isometric view of FIG. 7.

As shown in this figure, one of the principal faces of an alumina wafer 15 carries a metallization layer 27 which performs the function of the ground plane. This metallization layer includes two upwardly directed portions which connect two sets of conductive strips 5, 6 to the ground 6, said strips being disposed in the zone ABCD of the top face 28 of the wafer 15. Outside the zone ABCD, said top face 28 carries two Lange couplers 1, 2, 3, 4 having channels 2 connected to matched loads 29 and 30. A microwave amplifier circuit 32 is connected by means of leads 33 and 34 to the channels 1 of the two Lange couplers. The zone ABCD is covered with an yttrium-iron-garnet layer 12 formed by epitaxial growth on a gallium-gadolinium garnet substrate 10. For the sake of enhanced clarity of the drawing, the ferrimagnetic assembly is shown as being separated from the wafer 15 whereas this assembly in fact rests on the face 28. In consequence, provision is thus made for a volume magnetostatic wave delay line which makes use of two unidirectional transducers. A loop is formed by said delay line in conjunction with the circuit 32 and oscillates at a frequency which is a function of the time-lag of the magnetostatic waves which propagate between the strips 5 in the direction OX. The axis o-x forms part of a trirectangular trihedron, the axis o-z of which is perpendicular to the layer 12 and the axis o-y of which has the orientation of the strips 5 and 6.

Frequency tuning is dependent on a magnetic field Ha produced within the layer 12 by inductive means 31. Adjustment of the intensity of the field Ha makes it possible to vary the operating frequency of the oscillator.

Figures 8, 9, 10:
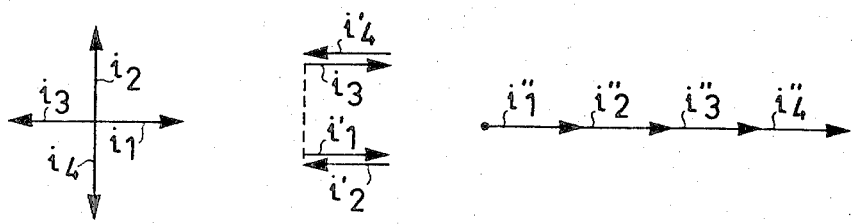
FIGS. 8, 9 and 10 are explanatory diagrams.

The unidirectional radiation can be extended generally to transducers which are provided with more than two equidistant conductive strips. It is possible, for example, to excite an array of four conductive strips by means of four-phase currents $i_1$, $i_2$, $i_3$ and $i_4$ as shown in FIG. 8. The amplitudes of these currents are equal and their respective phase shifts form an arithmetical progression having a common difference equal to 90°. The distance between the conductive strips is chosen so as to ensure that the volume magnetostatic wave undergoes a 90° phase shift as it travels along this distance. In one direction of propagation, currents $i'_1$, $i'_2$, $i'_3$ and $i'_4$ having a zero resultant can be generated within a receiving strip by the elementary magnetostatic waves as shown in FIG. 9. In the other direction of propagation, the elementary magnetostatic waves induce currents $i''_1$, $i''_2$, $i''_3$ and $i''_4$ in phase coincidence as shown in FIG. 10. Unidirectionality of radiation of an array of P strips can be ensured with a P-phase polyphase transformer. From the point of view of simplicity, the two-phase system is the most advantageous but more complex systems may offer advantages which are specific to the application which is contemplated.

Without departing from the field of the present invention, two unidirectional transducers which radiate in the same direction may be associated with a third transducer employed as a receiver. This configuration can be deduced from FIG. 6 by replacing the transducer 13 by a unidirectional transducer. The two transducers which follow each other and radiate in the same direction are decoupled with respect to each other although they remain capable of exchanging volume magnetostatic waves with the third transducer.

What is claimed is:

1. A volume magnetostatic wave device for operating at a predetermined wavelength provided with at least one microstrip transducer at the surface of a wafer of ferrimagnetic material, wherein said transducer comprises at least one pair of filament-type conductive elements spaced at a predetermined interval from each other and having the same length, the terminals of said transducer being connected electrically to the conductive elements through a polyphase transformer circuit, the currents which flow through said conductive elements being equal and in phase quadrature so that the waves produced by said currents add to each other in one direction and cancel each other in the other direction.

2. A device according to claim 2, wherein the transducer comprises two conductive elements, said polyphase transformer circuit being a 3-dB hybrid junction in which the output channels cause currents in phase quadrature to flow through said conductive elements.

3. A device according to claim 2, wherein said hybrid junction is constituted by an interdigitized-microstrip coupler for ensuring close electromagnetic coupling between the input and output channels.

4. A device according to claim 1, wherein the conductive elements and the polyphase transformer circuit are constituted by metallization deposits formed on one of the principal faces of a wafer of dielectric material, the other principal face of said wafer being covered with a metallization deposit which performs the function of a ground plane, the wafer of ferrimagnetic material being intended to cover a zone of the dielectric wafer which contains the conductive elements.

5. A device according to claim 1, wherein the wafer of ferrimagnetic material is an epitaxial yttrium-iron garnet layer formed on a substrate cut in a gadolinium-gallium garnet.

6. A device according to claim 1, wherein said device comprises at least two unidirectional-radiation transducers.

7. A device according to claim 6, wherein said device further comprises at least one bidirectional-radiation transducer.

8. A device according to claim 1, wherein the ferrimagnetic wafer is subjected to a polarizing magnetic field.

9. A device according to claim 6, wherein said device comprises amplifying means connected electrically to the unidirectional-radiation transducers in order to constitute an oscillating loop.

10. A device according to claim 9, wherein tuning means produce a magnetic field of adjustable intensity within the ferrimagnetic wafer.

* * * * *